United States Patent
Sachs et al.

(10) Patent No.: US 10,549,476 B2
(45) Date of Patent: Feb. 4, 2020

(54) METHODS AND APPARATI FOR HANDLING, HEATING AND COOLING A SUBSTRATE UPON WHICH A PATTERN IS MADE BY A TOOL IN HEAT FLOWABLE MATERIAL COATING, INCLUDING SUBSTRATE TRANSPORT, TOOL LAYDOWN, TOOL TENSIONING AND TOOL RETRACTION

(71) Applicant: 1366 TECHNOLOGIES, INC., Bedford, MA (US)

(72) Inventors: Emanuel M. Sachs, Newton, MA (US); Peter E. Kane, Westwood, MA (US); Holly G. Gates, Somerville, MA (US); Damian W. Harris, St. Louis Park, MN (US); Benjamin F. Polito, Gorham, ME (US); Hector A. Inirio, Somerville, MA (US)

(73) Assignee: 1366 TECHNOLOGIES, INC., Bedford, MA (US)

( * ) Notice: Subject to any disclaimer, the term of this patent is extended or adjusted under 35 U.S.C. 154(b) by 825 days.

(21) Appl. No.: 14/345,681

(22) PCT Filed: Sep. 22, 2012

(86) PCT No.: PCT/US2012/056770
§ 371 (c)(1),
(2) Date: Mar. 19, 2014

(87) PCT Pub. No.: WO2013/044181
PCT Pub. Date: Mar. 28, 2013

(65) Prior Publication Data
US 2014/0367887 A1 Dec. 18, 2014

Related U.S. Application Data

(60) Provisional application No. 61/538,542, filed on Sep. 23, 2011.

(51) Int. Cl.
*G03F 7/00* (2006.01)
*B29C 59/02* (2006.01)

(52) U.S. Cl.
CPC ............ *B29C 59/02* (2013.01); *G03F 7/0002* (2013.01)

(58) Field of Classification Search
CPC . B29C 59/02; B29C 59/022; B29C 2059/023; B29C 43/10
See application file for complete search history.

(56) References Cited

U.S. PATENT DOCUMENTS 3,868,901 A * 3/1975 Valiela ................ B41F 15/0895
101/379
4,098,184 A * 7/1978 Okada ................... B41F 17/006
101/115
(Continued)

FOREIGN PATENT DOCUMENTS

CN     101228607     7/2008
GB     1354615        6/1974
(Continued)

OTHER PUBLICATIONS

International Preliminar Report on Patentability, dated Apr. 3, 2014 for PCT/US2012/056770, to which the present application claims priority.
(Continued)

*Primary Examiner* — Matthew J Daniels
(74) *Attorney, Agent, or Firm* — The Marbury Law Group, PLLC

(57) ABSTRACT

A workpiece is transported using a porous belt, which belt delivers a workpiece to a chuck, upon which the workpiece is held by vacuum. The belt can be porous PTFE. A flexible
(Continued)

stamp is preheated, before it is applied to a workpiece, by drawing the stamp toward a heated plate, for instance by vacuum.

15 Claims, 12 Drawing Sheets

(56) References Cited

U.S. PATENT DOCUMENTS

| | | | | |
|---|---|---|---|---|
| 4,928,588 | A * | 5/1990 | Mathis | B41F 17/00 101/25 |
| 5,427,599 | A * | 6/1995 | Greschner | B29D 17/005 100/211 |
| 6,900,989 | B2 | 5/2005 | Sakata | |
| 2002/0132482 | A1* | 9/2002 | Chou | B29C 43/003 438/692 |
| 2004/0090611 | A1* | 5/2004 | Choi | B29C 43/003 355/75 |
| 2004/0219249 | A1* | 11/2004 | Chung | B29C 59/022 425/385 |
| 2005/0051698 | A1* | 3/2005 | Sreenivasan | B29C 43/003 249/135 |
| 2006/0108711 | A1* | 5/2006 | Yu | B82Y 10/00 264/293 |
| 2006/0172031 | A1* | 8/2006 | Babbs | B82Y 10/00 425/385 |
| 2006/0172553 | A1* | 8/2006 | Choi | H01L 21/6831 438/780 |
| 2007/0000826 | A1* | 1/2007 | Stevens | B30B 5/02 210/153 |
| 2007/0018363 | A1 | 1/2007 | Corrigan | |
| 2009/0246309 | A1* | 10/2009 | Washiya | B29C 35/0888 425/174.6 |
| 2010/0291257 | A1* | 11/2010 | Resnick | B82Y 10/00 425/385 |
| 2011/0129956 | A1 | 6/2011 | Polito et al. | |

FOREIGN PATENT DOCUMENTS

| | | |
|---|---|---|
| KR | 10-2011-0007173 A | 1/2011 |
| WO | WO 2009128946 A1 * | 10/2009 ........... B29C 43/021 |

OTHER PUBLICATIONS

Communication from the EPO dated Mar. 31, 2015 with extended Search Report. The European Patent Application No. 12833284.8 claims priority to PCT/US2012/056770 to which the present application claims priority.
Notice of Supplementary Search Report from the EPO dated Apr. 17, 2015. The European Patent Application No. 12833284.8 claims priority to PCT/US2012/056770 to which the present application claims priority.
First Office Action and Search Report from the State Intellectual Property Office dated Jan. 20, 2016. The Chinese Patent Application No. 201280057891.3 claims priority to PCT/US2012/056770 to which the present application claims priority.
Second Office Action and Search Report from the State Intellectual Property Office dated Nov. 30, 2016. The Chinese Patent Application No. 201280057891.3 claims priority to PCT/US2012/056770 to which the present application claims priority.
Notification to Grant Patent Right for Invention from the State Intellectual Property Office dated Jun. 2, 2017.The Chinese Patent Application No. 201280057891.3 claims priority to PCT/US2012/056770 to which the present application claims priority.
Search Report from the TIPO dated Jul. 1, 2016. The Taiwanese Patent Application No. 101134892 claims priority to PCT/US2012/056770 to which the present application claims priority.
Examination Report from the TIPO dated Jul. 1, 2016. The Taiwanese Patent Application No. 101134892 claims priority to PCT/US2012/056770 to which the present application claims priority.
Notice of Allowance from the TIPO dated Dec. 30, 2016.The Taiwanese Patent Application No. 101134892 claims priority to PCT/US2012/056770 to which the present application claims priority.
Korean Intellectual Property Office, Notice of Preliminary Rejection for KR Application No. 10-2014-7010517, dated Sep. 2, 2018.
Korean Intellectual Property Office, Notice of Final Rejection for KR Application No. 10-2014-7010517, dated Jun. 11, 2019.

* cited by examiner

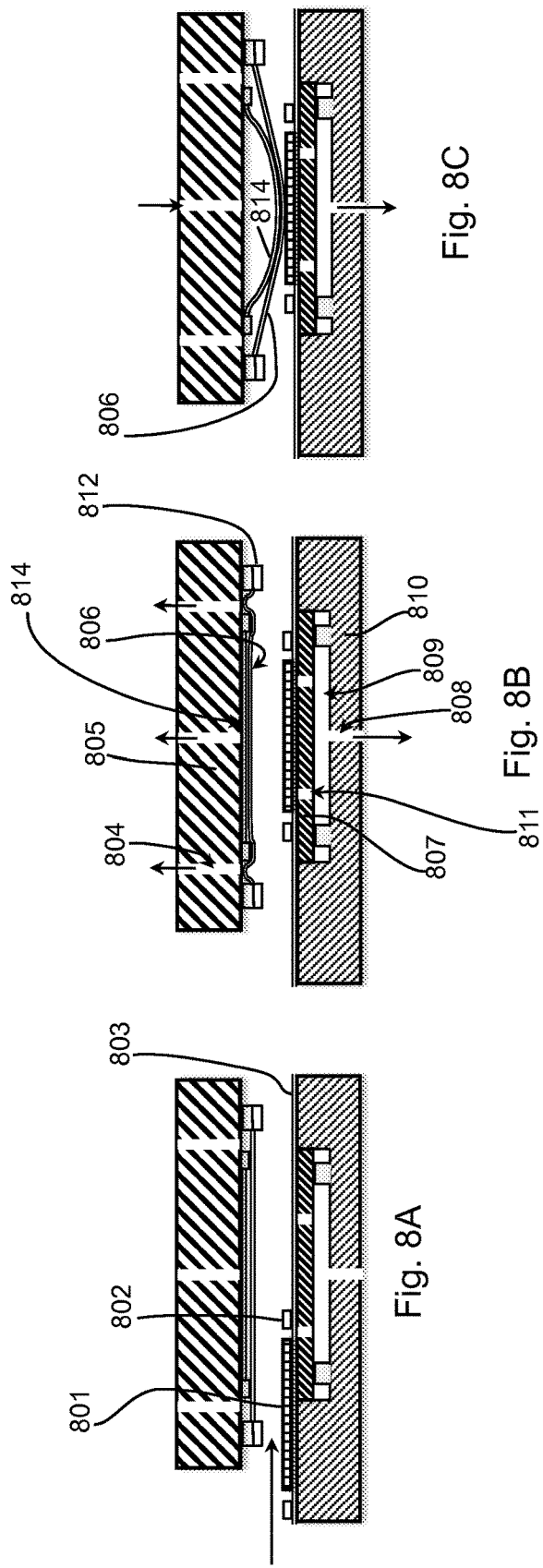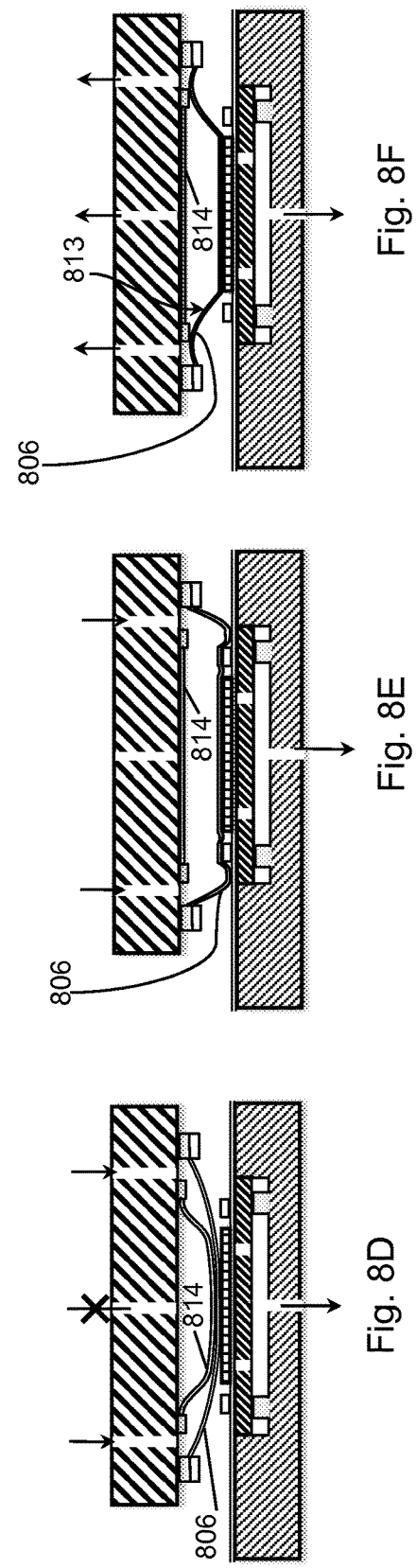

METHODS AND APPARATI FOR HANDLING, HEATING AND COOLING A SUBSTRATE UPON WHICH A PATTERN IS MADE BY A TOOL IN HEAT FLOWABLE MATERIAL COATING, INCLUDING SUBSTRATE TRANSPORT, TOOL LAYDOWN, TOOL TENSIONING AND TOOL RETRACTION

RELATED DOCUMENTS

This is the 35 U.S.C. § 371 U.S. National Phase of Patent Cooperation Treaty application No. PCT/US2012/056770, entitled, METHODS AND APPARATI FOR HANDLING, HEATING AND COOLING A SUBSTRATE UPON WHICH A PATTERN IS MADE BY A TOOL IN HEAT FLOWABLE MATERIAL COATING, INCLUDING SUBSTRATE TRANSPORT, TOOL LAYDOWN, TOOL TENSIONING, AND TOOL RETRACTION, International filing date of Sep. 22, 2012, to which the benefit of priority is hereby claimed. The PCT application claims the benefit of U.S. Provisional application No. 61/538,542, filed on Sep. 23, 2011, entitled METHODS AND APPARATI FOR HANDLING, HEATING AND COOLING A SUBSTRATE UPON WHICH A PATTERN IS MADE BY A TOOL IN HEAT FLOWABLE MATERIAL COATING, INCLUDING SUBSTRATE TRANSPORT, TOOL LAYDOWN, TOOL TENSIONING, AND TOOL RETRACTION. The entire disclosure of each application mentioned above is hereby incorporated fully herein, by reference.

A PCT application, designating the United States, is being filed on the same date, herewith, in the name of Emanuel M. Sachs, submitted by the USPTO Electronic Filing System under Attorney Docket No. 1366-0066-0070PCT, entitled, TECHNIQUES FOR IMPROVED IMPRINTING OF SOFT MATERIAL ON SUBSTRATE USING STAMP INCLUDING UNDERFILLING TO LEAVE A GAP AND PULSING STAMP, which PCT application claims priority to U.S. Provisional Application No. 61/538,489 of the same title, filed on Sep. 23, 2011. The PCT application is referred to herein below as the co-pending application and is hereby fully incorporated herein by reference. The priority Provisional application is also hereby fully incorporated herein by reference.

INTRODUCTION

Certain processing schemes and architecture are disclosed in Patent Cooperation Treaty Application No: PCT/US2008/002058, entitled, SOLAR CELL WITH TEXTURED SURFACES, Filed: Feb. 15, 2008, in the names of Emanuel M. Sachs and James F. Bredt and The Massachusetts Institute of Technology, designating the United States of America, the National Phase of which is U.S. patent application Ser. No. 12/526,439, issued as U.S. Pat. No. 8,257,998 on Sep. 4, 2012, and also claiming priority to two provisional United States applications, No. U.S. 60/901,511, filed Feb. 15, 2007, and No. U.S. 61/011,933, filed Jan. 23, 2008. All of the PCT application, the U.S. Patent, patent application, and the two US provisional applications are hereby incorporated fully herein by reference. The technology disclosed in these applications is referred to herein collectively as Self Aligned Cell (SAC) technology.

Certain additional processing methods and apparatus are disclosed in Patent Cooperation Treaty Application No. PCT/US2009/002423, entitled WEDGE IMPRINT PATTERNING OF IRREGULAR SURFACE, filed Apr. 17, 2009, in the names of Benjamin F. Polito, Holly G. Gates and Emanuel M. Sachs, and the Massachusetts Institute of Technology and 1366 Industries Inc., designating the United States of America, the National Phase of which is U.S. patent application Ser. No. 12/937,810, and also claiming priority to two provisional United States applications, No. U.S. 61/124,608, filed Apr. 18, 2008, and No. U.S. 61/201,595, filed Dec. 12, 2008. All of the PCT application, the U.S. Patent application, and the two US provisional applications are hereby incorporated fully herein by reference. The technology disclosed in the applications mentioned in this paragraph is referred to herein collectively as wedge imprint technology or wedging technology, although in some instances protrusions having shapes other than wedges may be used. The related applications are referred to below as the Wedging applications.

In brief, such wedge imprint technology includes methods. Patterned substrates with a specified texture for photovoltaic and other uses are made. As shown with reference to FIGS. 1, 2, 3, 4, and 5 and 6, the substrates are made by impressing protrusions 112 of a flexible stamp 110, upon a thin layer 202 of resist material, which covers a substrate wafer 204. The stamp tool used is of a material (typically elastomeric) that is soft enough so that the tool deforms upon contact with the substrate or wafer 204 upon which a coating of resist 202 has been previously applied. FIG. 3 shows the protrusions 112 of the stamp 110 just contacting the surface 203 of resist 202. The resist becomes soft upon heating and moves away from the locations of impression at the protrusions 112 under conditions of heat and pressure, revealing regions of the substrate adjacent to the protrusion. (The resist can be heated before or after the protrusions contact the resist or both before and after, as well as during.) The substrate is then cooled with the stamp 110 in place, and the stamp is removed, as shown at FIG. 5, leaving regions 522 of the substrate exposed under holes 521, from where the resist has been moved away. The substrate is further subjected to some shaping process, typically an etching process. Exposed portions 522 of the substrate are removed by an action, such as etching, and portions of the substrate that are protected by the resist, remain, as shown in FIG. 6 at 622 (etched away) and 623 (un-etched, or less etched) respectively.

It is also possible, for some applications, that the stamp protrusions do not deform upon contact with the resist material, but rather, simply due to their volume, they replace enough of the resist such that etching can take place. For instance, this may occur if the protrusions are flat ended, and simply by forcing them into the resist material, the resist is moved away from its original location.

A typical substrate is silicon, and a typical resist is a wax or a mixture of waxes, resins and rosins. The stamp may be used over and over again. The protrusions of the stamp may be discrete, spaced apart, such as the pyramidal elements 112 shown. Or, they may be extended, wedge shaped elements, such as shown in the wedging applications. Or, they may be a combination thereof, or any other suitable shape that can cause the resist material to move away from the original covering condition.

Thus, a stamp is used to pattern a resist layer on a workpiece, which is then subjected to a different shaping step, to shape the workpiece. The workpiece may then be used for photovoltaic, or other uses. Textures that can be provided to the workpiece include extended grooves, discrete, spaced apart pits, and combinations thereof, as well as intermediates thereof. Platen based techniques may be used for patterning the workpiece. Rough and irregular workpiece substrates may be accommodated by using extended stamp elements to insure that the shaped portion of the stamp contacts the surface of the workpiece. Methods described in the wedging application and above are referred to herein as wedge imprinting or wedging.

It is beneficial for a process to apply such patterns to be able to produce a patterned element relatively quickly. It is also beneficial to provide such an element without damaging the substrate. Such damage may arise if too much force were to be applied to the substrate while pressing the pattern. Damage may also arise due to thermal cycling that is applied to soften the flowable material for patterning, and then to again harden it for retaining such patterns. Such damage might also arise from separating the tool from the substrate, as covered with the flowable material. It is also typically beneficial to be able to heat and cool the substrate, and the flowable material thereon. It would be beneficial to have a heating and cooling system that can heat and/or cool the substrate quickly, but without causing unacceptable stresses in the wafer, which might cause it to fracture. Other potential problems may arise if air becomes trapped between the tool and the resist coated wafer. Trapped air gives rise to unwanted pressure regimes, that are hard to anticipate and to control because such trapped air may also give rise to locations of spuriously non-uniform pressure, and thus, irregularity in the size of the holes in the resist created. It is beneficial for there to be minimal, and, ideally, no air trapped between the tool and the resist layer. It is also important to be able to securely and rapidly move a substrate to a processing station, to then hold the substrate workpiece as a process is applied to it, and then to securely and rapidly move it to a subsequent processing station. It is also important to be able to both apply the stamp to the substrate, and then remove it from the substrate, without damaging the substrate and also without disturbing the flowable material, which is to be patterned, or, which has just been patterned.

Another problem that may arise is because the tool is heated and cooled during the process. This could give rise to dimensional changes, which would then give rise to unwanted dimensional differences in the pattern made in the resist material.

Thus, it is desired to have a system that can rapidly and securely handle a substrate, to move it to a processing station, to then hold the substrate workpiece as a process is applied to it, and then to securely and rapidly move it to a subsequent processing station. It is also desired to have a method in which no, or at most only minimal air is trapped in pockets between the flowable resist material and the stamp tool as it is brought to bear. It is further desired to provide a system that enables the rapid heating and cooling of the substrate and the flowable resist material thereon, without cracking or otherwise unacceptably stressing the substrate, yet at a speed that is commercially acceptable. It is also desirable to be able to remove the tool from the resist material after patterning, without damaging the substrate or the newly formed pattern. It is also desirable to provide a system in which heating and cooling the tool does not give rise to dimensional changes or irregularities in the pattern that is provided in the flowable resist material. It would also be desirable to develop a system that is reliable and reproducible.

These and other objects and aspects of inventions disclosed herein will be better understood with reference to the Figures of the Drawing, of which:

BRIEF DESCRIPTION OF THE FIGURES OF THE DRAWING

FIG. 8A shows, schematically in cross-section, an apparatus in condition for a step in a process invention hereof, similar to that shown in FIGS. 7A-7H, also including a centrally located flexible bladder;

FIG. 8B shows the apparatus of FIG. 8A, with the substrate held in place upon the chuck by a vacuum, and the stamp and central bladder drawn toward a heated plate;

FIG. 8C shows the apparatus of FIG. 8A, with the central bladder inflated, with the stamps center beginning to press upon the center of the substrate;

FIG. 8D shows the apparatus of FIG. 8A, with the bladder of the stamp also being inflated, such that a larger, yet still incomplete portion of the stamp presses upon the substrate;

FIG. 8E shows, the apparatus of FIG. 8A, with the stamp fully pressed upon the full extent of the substrate, and also beyond the extent of the substrate, and the central bladder withdrawn to its initial, rest position;

FIG. 8F shows the apparatus of FIG. 8A, as the stamp is beginning to be withdrawn by a vacuum pressure, away from the chuck, yet before the stamp has begun to be peeled from the substrate itself;

BRIEF SUMMARIES

Figure 1:
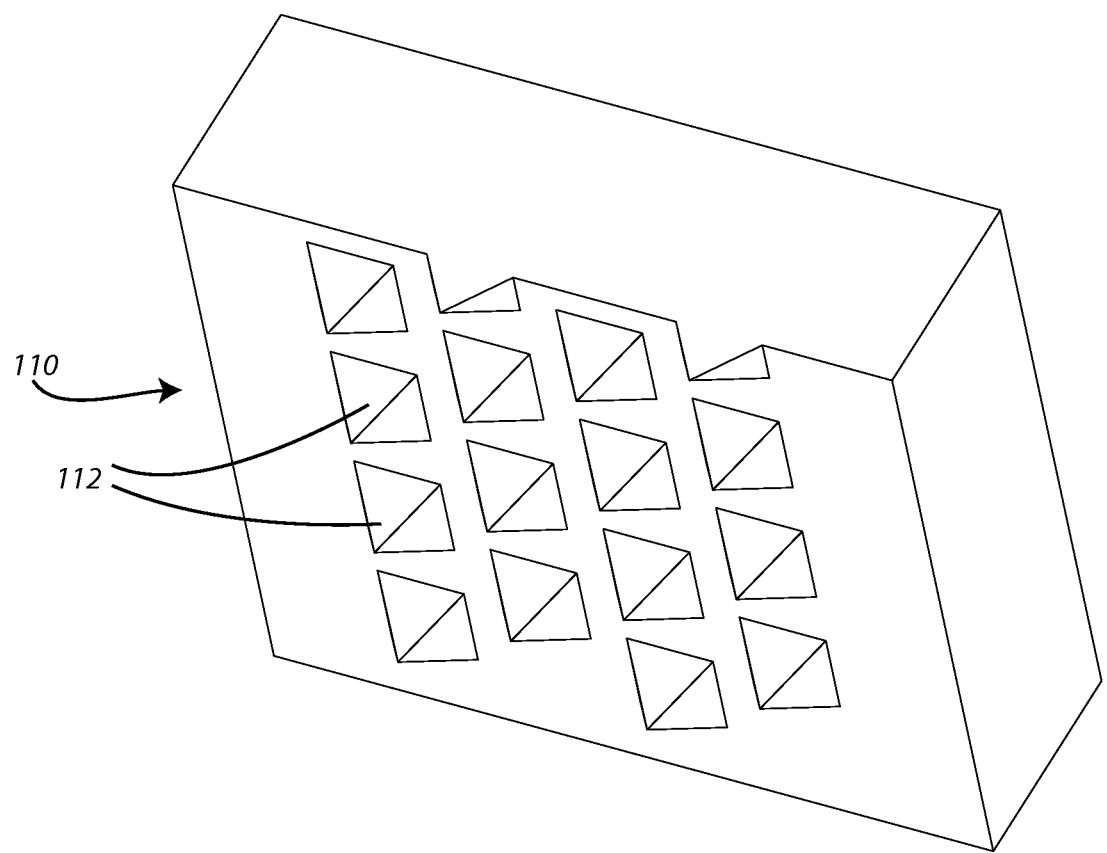
FIG. 1 shows, schematically, a stamp used for wedging (prior art)
Figure 2:
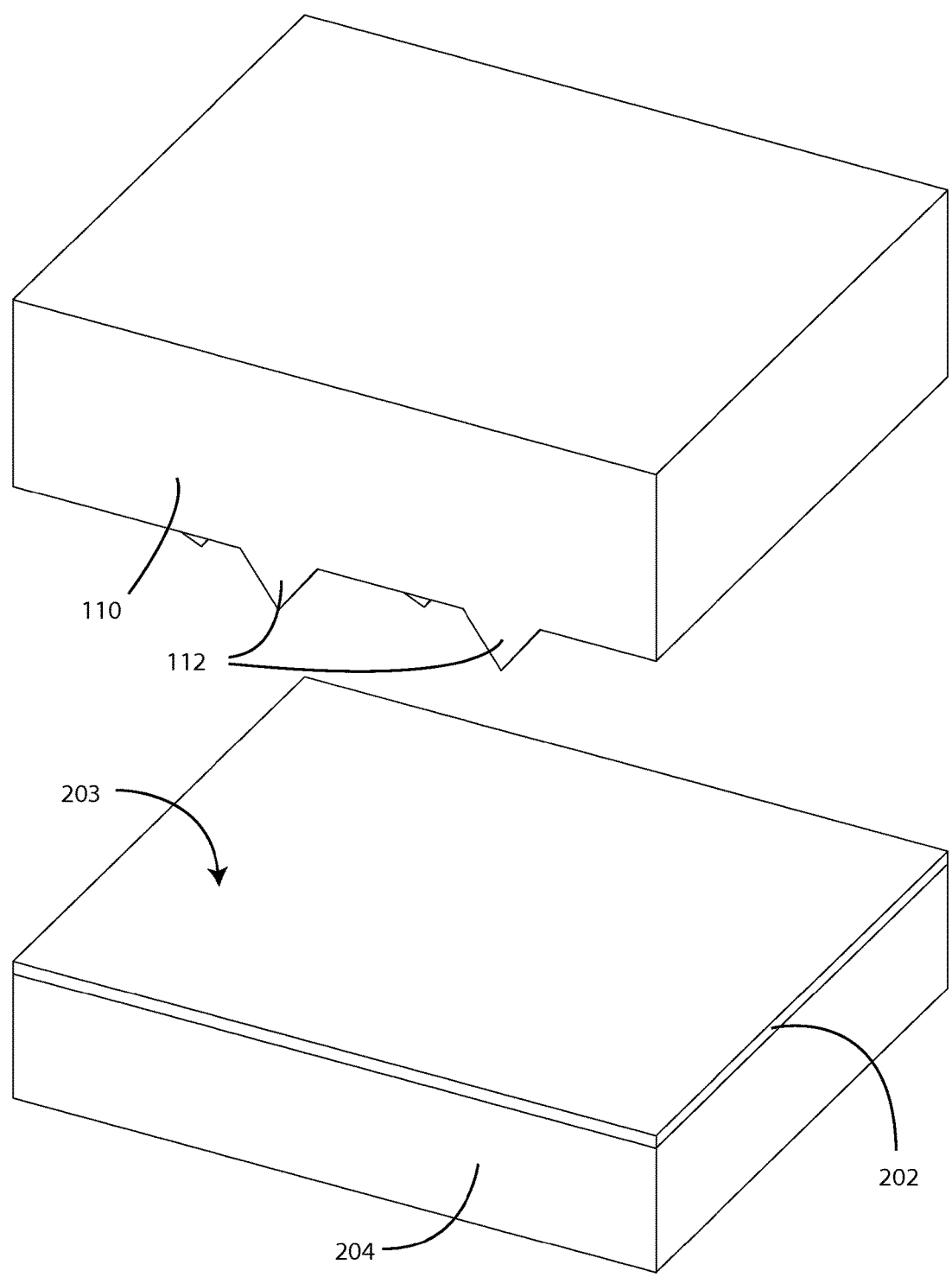
FIG. 2 shows, schematically, the stamp of FIG. A and a substrate coated with resist, to be patterned by the stamp (prior art)
Figure 3:
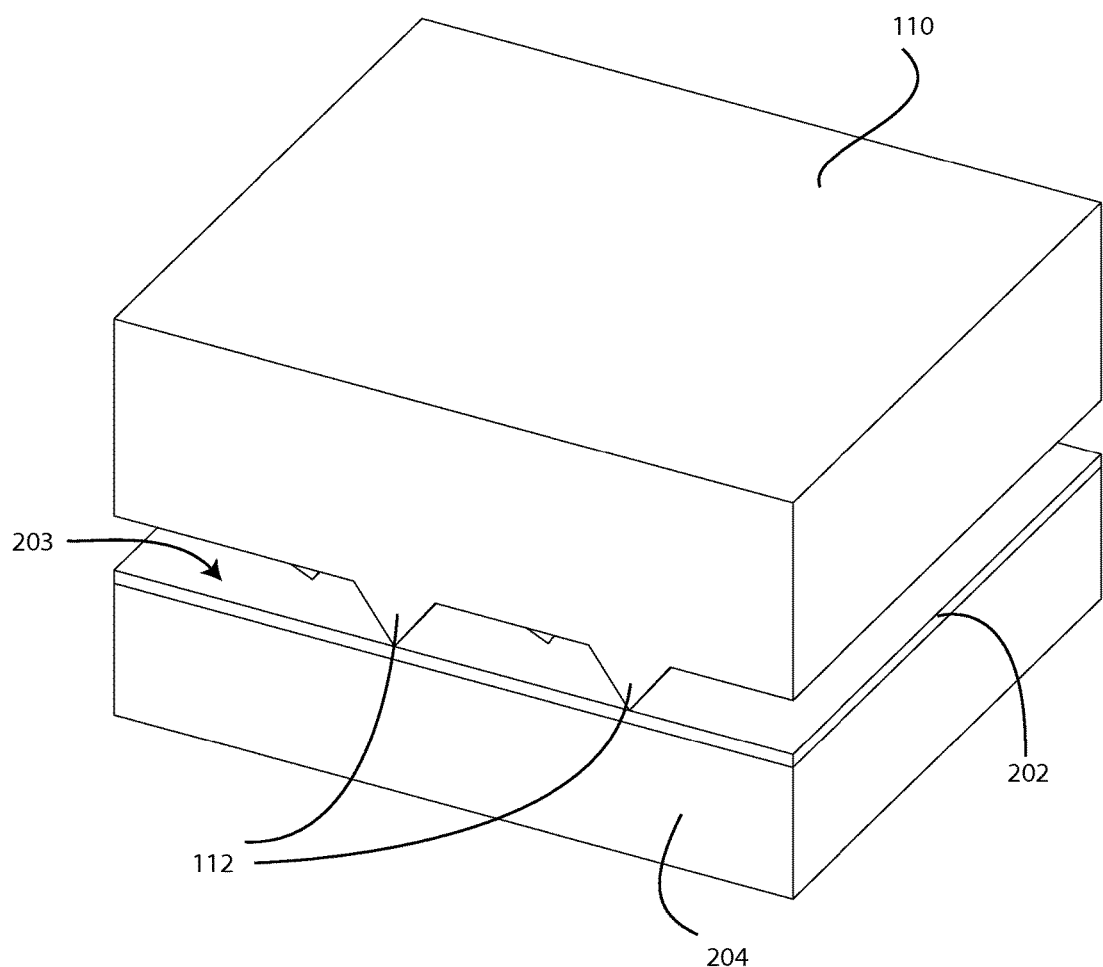
FIG. 3 shows, schematically, the stamp and substrate of FIG. 2, with tips of protrusions of the stamp just contacting the resist (prior art)
Figure 4:
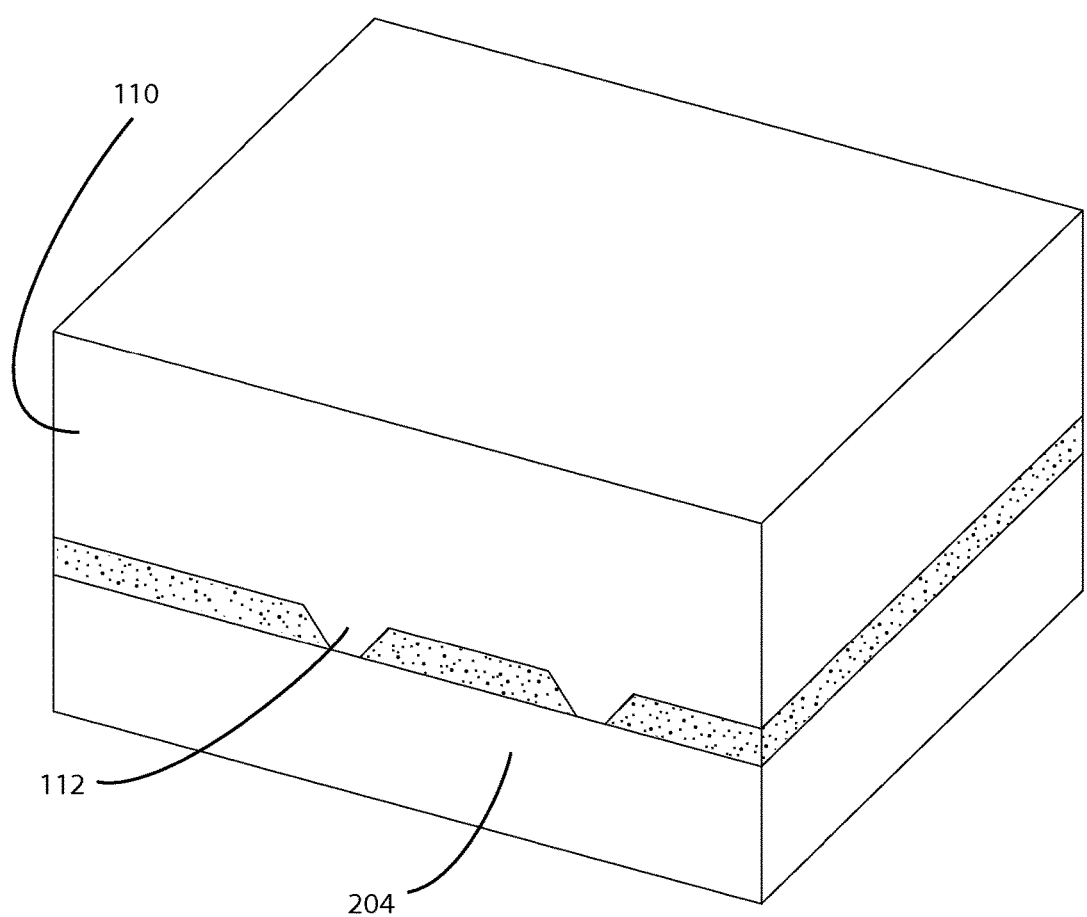
FIG. 4 shows schematically a stamp and a substrate operating in filled mode, with the protrusions of the stamp deformed and pressed against the substrate, and with resist substantially filling the space between the substrate and the body of the stamp (prior art)
Figure 5:
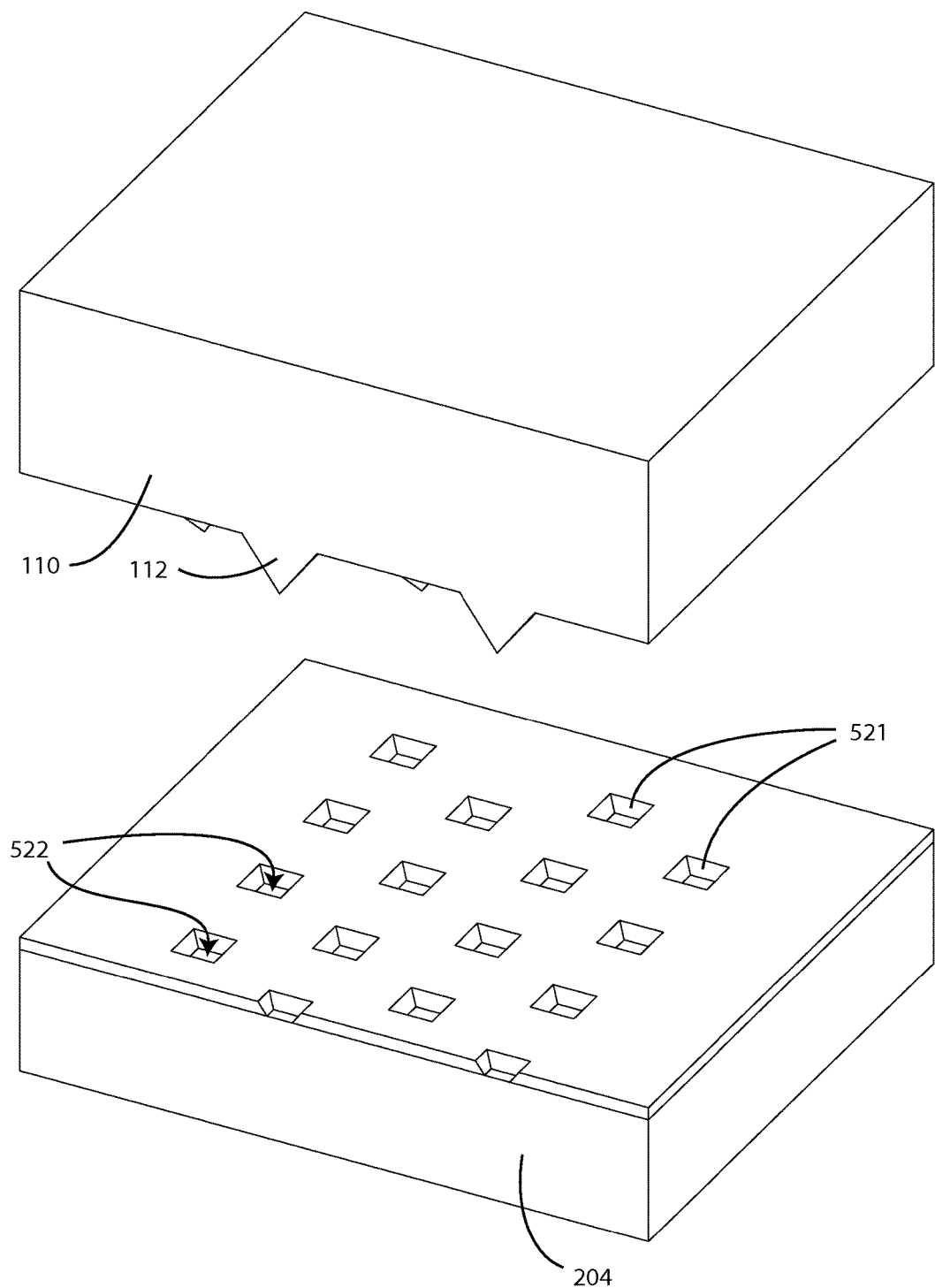
FIG. 5 shows, schematically, a stamp and substrate, with a patterned resist coating the substrate after wedging with the stamp (prior art)
Figure 6:
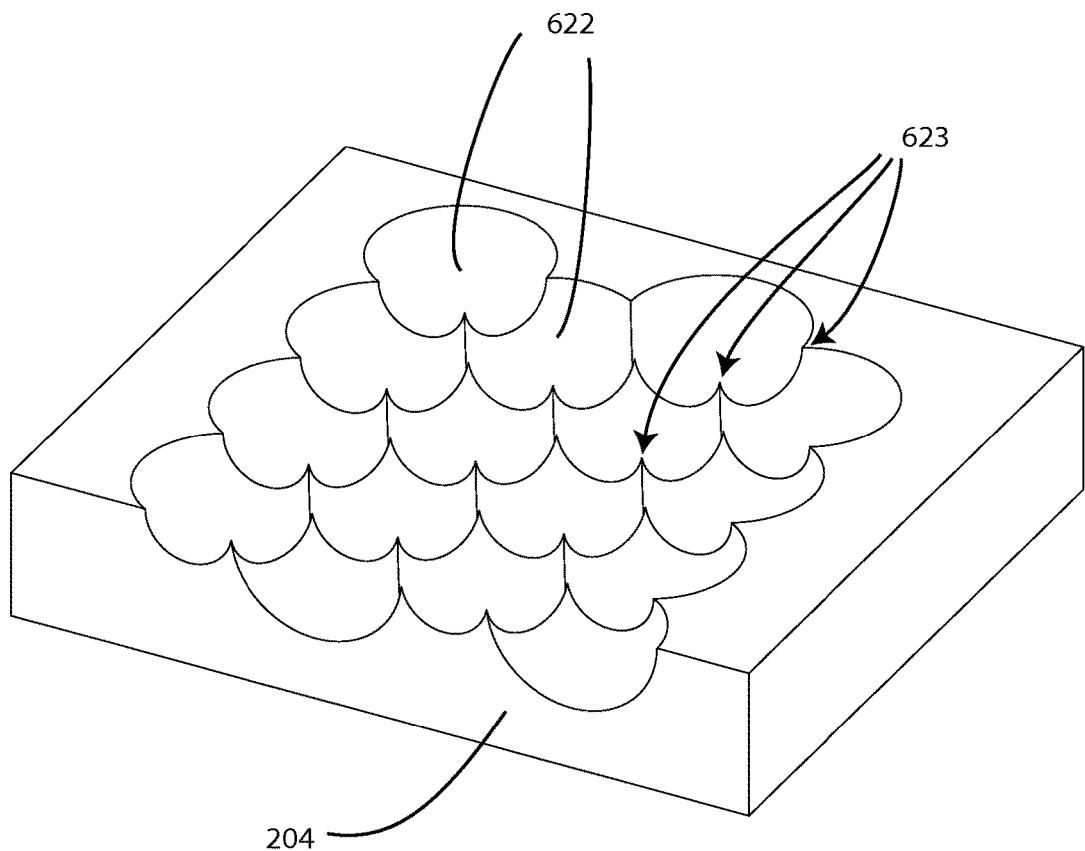
FIG. 6 shows, schematically, a substrate after etching, with a patterned resist mask as shown in FIG. 5 (prior art)

One method invention hereof is a method of transporting a workpiece, using a porous belt, which belt delivers a workpiece to a chuck, upon which the workpiece is held by vacuum or differential air pressure. An apparatus invention hereof is a porous belt, such as made of porous PTFE, and a chuck fitted with apertures by which a differential air pressure may be provided.

Another method invention hereof is a method of pre-heating a flexible stamp before it is applied to a workpiece, by drawing the stamp toward a heated plate, for instance by differential air, or vacuum pressure.

A related method invention hereof is a method to apply a flexible stamp to a workpiece, by contacting first the center of the stamp to the center of the workpiece, and then causing a contact line to move radially outward from this common center, thereby preventing or at least minimizing air from being trapped in pockets between the stamp and the covered workpiece. The stamp can be inflated by application of air pressure to the side of the stamp that has previously been drawn by differential pressure away from the workpiece toward a heated plate, for instance by inflating a flexible bladder that carries the stamp, or by using a centrally located additional bladder behind the flexible stamp and bladder.

Another invention hereof is a workstation to which the workpiece is secured by differential air pressure, which workstation has spaced adjacent to the location for the workpiece, spacers. The spacers have a surface that can be approximately co-planar with the work piece, or, in one embodiment, slightly taller than the workpiece, to prevent the stamp from sealing around the edges of the workpiece, by causing the stamp to bridge from the workpiece to the spacers, rather than draping around the edges of the work-piece. The spacers can also have a top surface that is significantly higher than the workpiece surface, in which case they are located further from the workpiece. A method that provides such spacers at a workstation is also an invention hereof.

Another method invention hereof is to pretension a flexible stamp before it is heated, so the stamp does not change dimensions upon heating and cooled, but rather, experiences a change of internal stress. Thus, the spatial dimensions of the pattern upon the stamp remain constant regardless of its temperature.

Another method invention hereof is the method of removing the patterned stamp from the workpiece after patterning, first by peeling the stamp away from the workpiece at the corners and outside edges of the workpiece, and then gradually inward toward the shared center of the workpiece and the stamp.

Still another method invention hereof is to heat the workpiece in such a manner that its outer perimeter is always at a temperature that is equal to or higher than the temperature of the center of the workpiece. A related method invention hereof is to cool the workpiece in such a manner that its outer perimeter is always at a temperature that is equal to or higher than the temperature of the center of the workpiece. Heating can be achieved by securing the work-piece to a channeled chuck, having radial channels that connect to a central and peripheral conduits, and by passing hot water to the peripheral conduits, then along the radial channels, and exiting the chuck through the central conduit. Cooling can be done by passing cooler water in the reverse direction.

An apparatus invention hereof is a chuck, such as described above.

In the present document, the item that has been referred to above as a stamp may also be called a tool. The elements of the stamp that protrude and are used to make impressions in the resist material are usually referred to as protrusions. They may also be called indenters, projections, wedges, and pyramids. The substrate upon which the resist material is provided, and then patterned, is typically referred to as a substrate. It may also be called a wafer or a workpiece. The material that is provided on the substrate may be referred to as resist, or as a flowable material, or, simply a material.

DETAILED DESCRIPTION

Overview

FIGS. 7A-7H show, schematically, a cross section view of an apparatus for wedging and illustrates a representative process sequence. A chuck 707 heats and cools a resist-coated substrate wafer 701. (Internal flow channels for heating and cooling chuck are not shown in FIGS. 7A-7F, but are shown in FIGS. 9, 9A, 10 and 10A). A porous belt 703 transports the resist-coated wafer 701 onto and off of the chuck. The chuck 707 is supported by thermally insulating support 710. As shown in FIG. 7, a vacuum is pulled through vacuum channel 708, vacuum plenum 709 and vacuum channels 711 in the chuck and through the porous belt 703, to hold the wafer down against the belt and chuck at a workpiece station. The workpiece is in place at the station in FIGS. 7 and following. This vacuum hold down provides for good thermal contact between the wafer and the chuck and later, will aid in peeling the tool from the wafer. The flexible tool/stamp 706 is clamped in a ring 712 under pre-tension so that the tool is flat until vacuum or pressure are applied to it through channels 704. A heated top plate 705 can be used to preheat the tool to a designated temperature by applying vacuum between the tool and the platen to pull the tool up against the platen and make good thermal contact between the two, as shown in FIG. 7. The heated top plate 705 may be made wholly or partly of transparent material, such as glass to facilitate viewing and control of the process. The tool may be carried on a flexible membrane, which is inflatable, such as a bladder. Or, the tool may itself be integral with a flexible membrane that constitutes a bladder.

At the start of a forming operation, a pressure is applied between the upper platen 705 and the tool to cause the tool to lay-down against the resist coated wafer 701, as shown in FIGS. 7 C-E. For instance, a suitable pressure would be between about 0.02 atm gauge to about 0.5 atm gauge, preferably about 0.1 atm gauge. The first contact can preferably be in the center of the wafer as shown in FIG. 7C and the tool continues to lay down, the contact region moving radially outward as shown in FIG. 7D and FIG. 7E. Radial lay-down avoids or at least minimizes trapping pockets of air between the stamp and the coated wafer by expelling it radially in advance of the tool. After the tool is brought to fully contact the wafer over substantially the entire area of the wafer, the pressure can be increased as the projecting indenters of the tool are pressed into the resist coating, and, brought into contact with the wafer surface underneath, thereby deforming to a predetermined degree of compression. Suitable pressures for this portion of the process may be as high as 2 atm. gauge. A spacer 702 (discussed more fully below) surrounds the wafer at a small distance from it as shown in FIG. 7E, and prevents the tool from conforming to the edges of the wafer and sealing against them. Peeling of the stamp from the wafer is accomplished by pulling a vacuum between top plate 705 and stamp 706 to pull the stamp up as shown at 713 in FIG. 7F. As vacuum is continued to be applied, the stamp 706 peels away from more of the wafer 701, separating in reverse of the pattern by which it was applied, separating first at the periphery, moving inward, finally separating at the center, as shown at FIGS. 7G and 7E. Vacuum can be applied to the space between the stamp 706 and the top plate 705 in any suitable way. One way is to draw vacuum, or reduced pressure relative to the pressure between the stamp and the substrate, at the periphery of the space between the top plate and the stamp. Channels can be provided from the periphery to the center. The channels can be formed in any suitable way. One way to form the channels is to provide radial spacers (not shown) on the side of the top plate facing the stamp, and to place the spacers near to each other, but leaving a channel therebetween. The vacuum can then be drawn from the periphery to the center, through these channels formed between the spacers.

Another aspect is to provide optimal shape and pressure during initial contact between the tool 706 and the wafer 701 so as to increase significantly the rate at which the air escapes from between the tool 706 and the wafer 701. In one embodiment, shown schematically with reference to FIGS. 8A, 8B, 8C, 8D, 8E, and 8F this pressure can be achieved by employing an additional inner bladder 814. This inner bladder can be situated between the tool 806 and the heated top plate 805, and can be of a smaller diameter than the tool 806. The pressure and vacuum can be supplied to the inner bladder 814 independently from the tool 806. During operation, the inner bladder 814 can be inflated fully while the tool 806 can be maintained at atmospheric pressure. For example, the inner bladder can be inflated to a pressure of up to about 0.5 atm gauge. After the inner bladder 814 is fully pressurized, the space between the inner bladder 814 and the back side of the tool 806 can be pressurized to 0.1 atm gauge, as with the above example, which will bring the tool into contact over the extent of the entire wafer 801. This level of pressure gives rise to a similar lay down as discussed above, such that no or very few pockets of trapped air arise. Pressure in this space, behind the tool then continues to increase, for instance up to about 2 atm. gauge, to deform the indenters into contact with the wafer beneath the resist coating. As the pressure between the inner bladder and the tool rises above 0.5 atm gauge, the inner bladder and the tool lose contact, because the pressure therebetween is higher than that behind the inner bladder, which is thus pushed away from the tool. The inner bladder can also be immobilized by blocking airflow to or from it. Breaking contact between the inner bladder 814 and the tool 806 minimizes potentially harmful interactions with the surface of the wafer 801 that could result from actively applying vacuum to the inner bladder 814. Once the inner bladder is fully deflated, it can then again be held against the heated top plate 805 under vacuum until the next cycle.

The introduction of the inner bladder 814 serves at least two functions. The first is to impart a beneficial shape to the tool at the start of the process. By leaving the tool essentially loose and using only the inner bladder to provide movement, the contact between the tool and the substrate begins at a sharper angle, which is better suited to push away trapped air from contacting the center of the substrate. The second function is to maintain a higher pressure during the entire air-clearing process than would be possible with only the tool. Because the inner bladder is mounted at a smaller diameter than the tool, it requires more pressure to achieve the same amount of deflection, and, by extension, surface contact. This higher pressure pushes out trapped air more quickly.

It should be noted that while it is beneficial to avoid any pockets of trapped air during the lay-down process, complete elimination of all trapped air is not necessary for an acceptable process in many cases.

Rather than advancing the tool toward the substrate using pneumatic pressure, such as air or another fluid as generally described above, the tool can be advanced using a mechanical apparatus that forces the tool toward and against the substrate. The same is also true regarding the central bladder, which can be advanced using a mechanical arrangement.

A typical stamp may have an overall thickness of approximately 0.3 mm, with the protrusion being approximately 0.01 mm (10 microns) (typically within a range of between about 2 and about 20 microns). Such a stamp will experience a uniform force upon the protrusions over a region that spans at least approximately 0.7 mm in each of two orthogonal directions. For irregularities smaller than that expanse, the force upon protrusions at such an irregularity will not be particularly close to the force on protrusions in other, more uniform regions. The stamp can have an overall thickness ranging between about 0.05 mm and about 1 mm, with a preferred range being between about 0.1 to about 0.5 mm. Thinner stamps are better able to conform to surface irregularities and roughness in the substrate. The combination of a thin and therefore very flexible stamp, together with hydrostatic pressure applied to the back of the stamp, provides a system which can create a high fidelity pattern on rough and undulating surfaces.

Protrusions on the tool can be separated by between about 5 microns and about 100 microns, or even more, depending on the design of the end product. Their height can be between about 2 microns to about 100 microns, or more, also with regard to the design of the end product. Typically, smaller protrusions will be spaced more closely together, although this is not necessarily so.

Heated and Cooled Chuck

The wafer 701 can beneficially be heated to soften the resist and enable the wedging process. After the wedging process, the wafer can beneficially be cooled prior to the tool being peeled. Heating and cooling are beneficially accomplished quickly, to allow for a high production rate. However, when rapidly heating and cooling a brittle material there is the possibility of causing fracture, due to thermal stresses. For example, in the case of heating a silicon wafer, if the center of the wafer is heated faster than the edges, a tensile stress will develop along the edges due to the higher expansion of the center. As microcracks and other defects are often found at the edges of wafers, this can lead to wafer breakage. However, at the same time, it is desirable that the entire wafer be at a uniform temperature once the heating cycle is concluded.

An aspect of an invention hereof is to cause the heating and cooling of the wafer to be accomplished in such a way that the center of the wafer is substantially always at the same or slightly lower temperature than the periphery of the wafer. When heating, the rate of increase of temperature at the periphery of the wafer is caused to be higher than the rate of increase in the center of the wafer. In this way, the periphery is always hotter than the center. As the wafer approaches the target temperature, the temperature difference between the periphery and the center diminishes and approaches zero. During cooling, the rate of decrease of temperature is caused to be higher in the center than at the periphery. Again, as the wafer approaches the target temperature, the temperature difference approaches zero.

Figure 9:
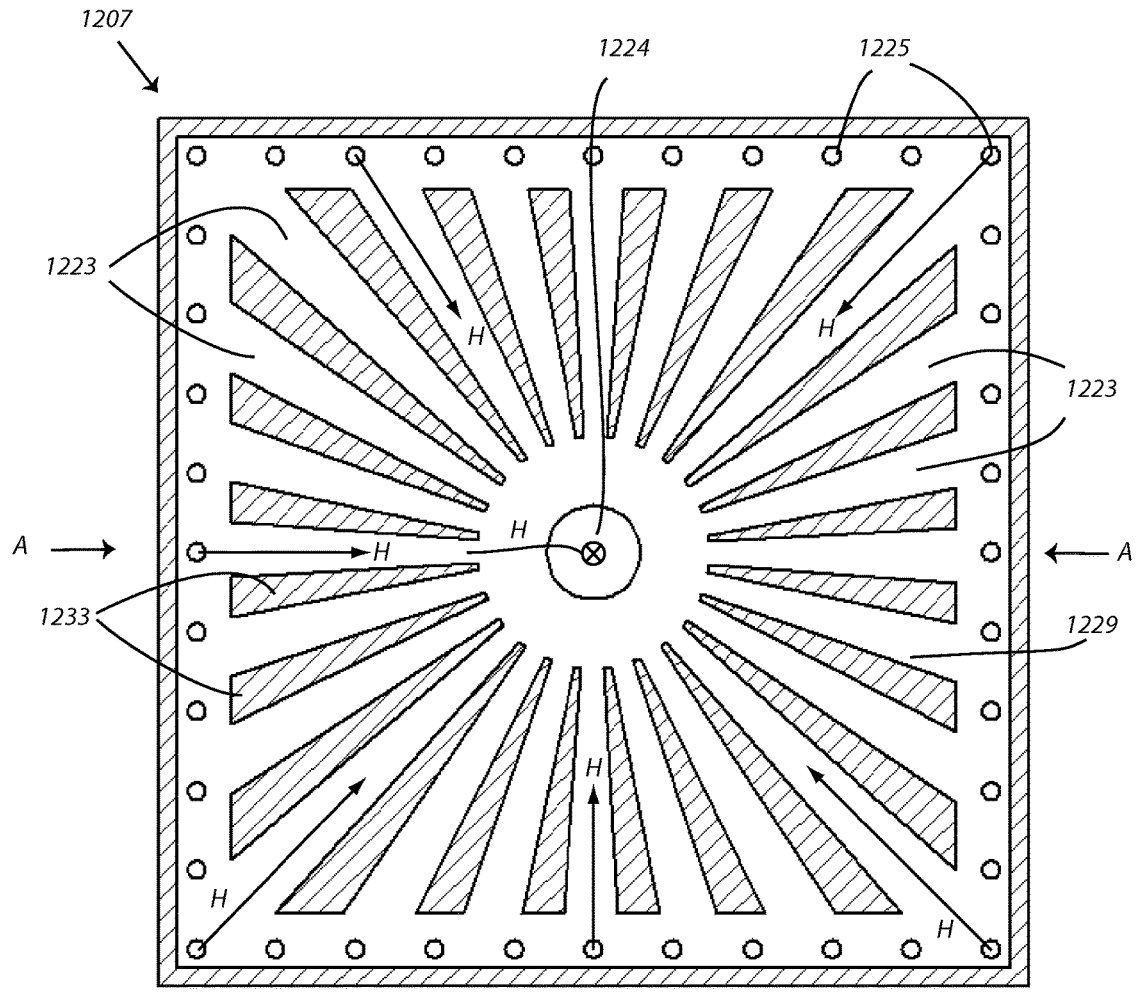
FIG. 9 shows, schematically in a cross-sectional plan view, a chuck of an invention hereof, showing an internal plenum and fluid flow directors for channeling heating and cooling fluid, with fluid flow patterns for heating shown.
Figure 9A:
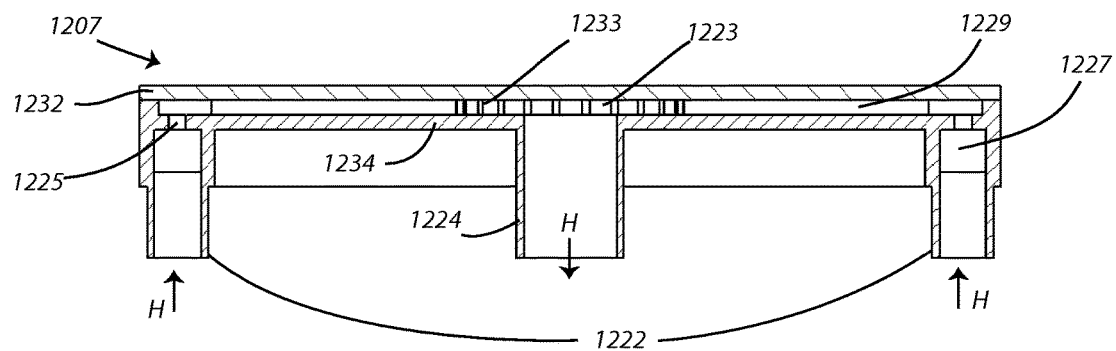
FIG. 9A shows, schematically in a cross-sectional view, the chuck of FIG. 9, along the lines A-A.
Figure 10:
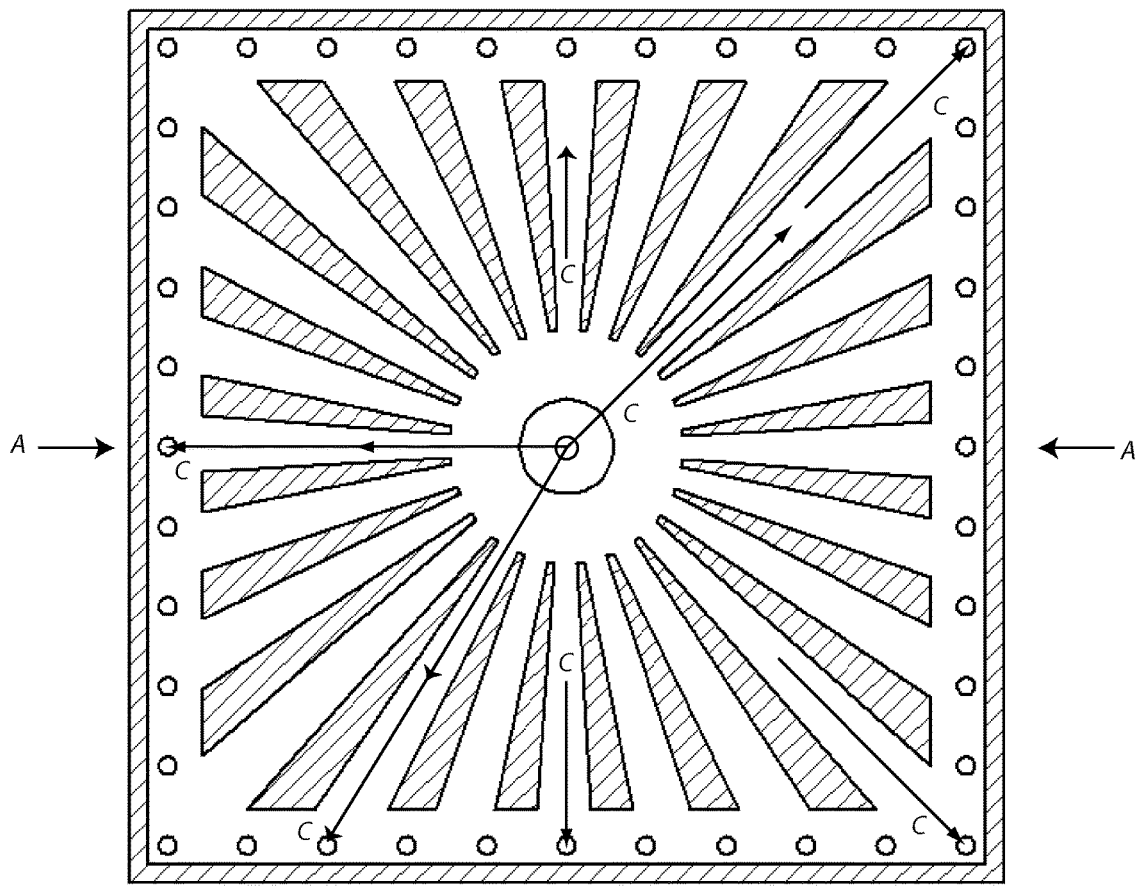
FIG. 10 shows, schematically in a cross-sectional plan view, the chuck of FIG. 9, with fluid flow patterns for cooling shown.
Figure 10A:
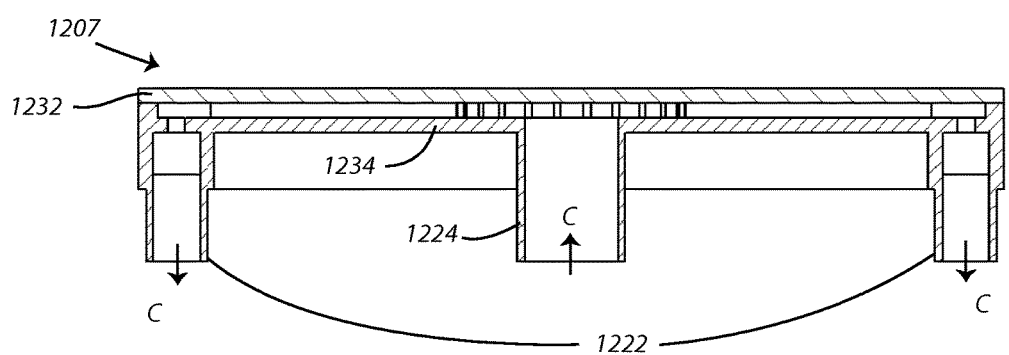
FIG. 10A shows, schematically in a cross-sectional view, the chuck of FIG. 10, along the lines A-A.
Figure 11:
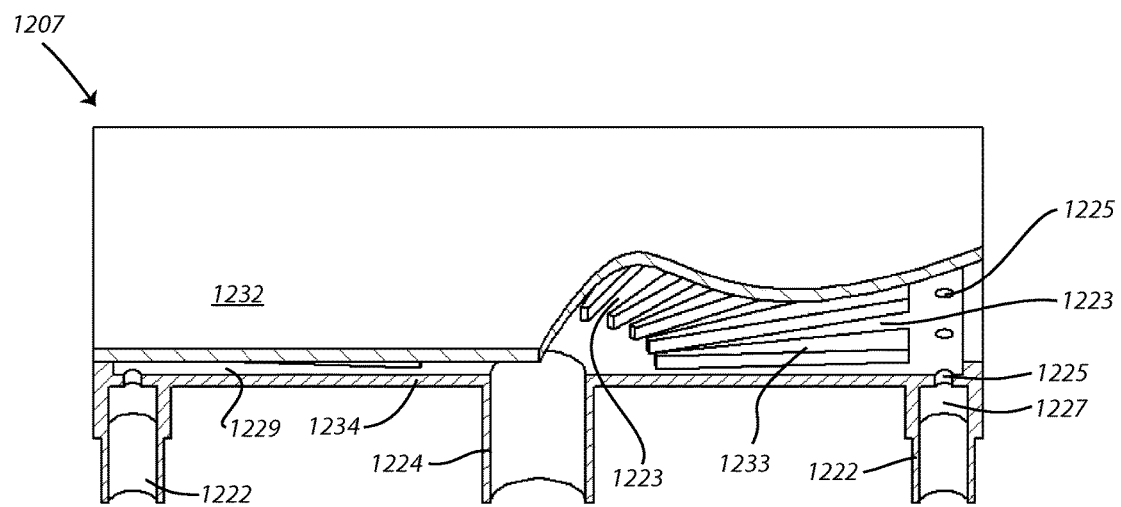
FIG. 11 shows, schematically in a view from above, at an angle, with a top plate removed, and a partial cross-section, the chuck of FIG. 9, showing an internal plenum and fluid flow directors for channeling heating and cooling fluid.

The temperature distribution over the wafer can be controlled by the temperature distribution across the chuck, which heats and cools it. In one method, as shown schematically with reference to FIGS. 9, 9A, 10 and 10A, fluid conducting pathways are provided within the body of the chuck 1207 and hot and cold water or other fluid is passed through the chuck to heat and cool it, respectively. FIGS. 9A and 10A are cross-sections of FIGS. 9 and 10, respectively, along the lines A-A. The pathways are arranged to create a radial flow pattern along radial channels 1223, between center and periphery. When the chuck is to be heated (shown schematically with reference to FIGS. 9 and 9A), hot water is admitted to the periphery conduits 1222 and it flows around a perimeter plenum 1227, through holes 1225 in a bottom plate 1234, into an extended plenum 1229, formed between the bottom plate 1234 and an upper plate 1232. Hot fluid continues along channels 1223, formed between these two plates and ribs 1233 toward the center conduit 1224, as indicated by arrows H. This flow pattern heats the periphery at a rate faster than the center. When the chuck 1207 is to be cooled, (shown schematically with reference to FIGS. 10 and 10A) cold water can be admitted to the center conduit 1224 and it flows in the reverse of that described above, radially outward, as indicated by arrows C, exiting by perimeter conduits 1222, thereby again keeping the periphery hotter than the center. Such switching can be achieved through the use of valves, such as solenoid-actuated valves. These elements are also shown with reference to FIG. 11 in a view from above, with a portion of the top plate 1232 removed, and a cross-section along lines A-A of FIG. 9. (It should be noted that FIGS. 9, 9A, 10, 10A and 11 show only the heating and cooling fluid flow features of the chuck. For clarity, they do not show the channels that are used for establishing a vacuum to hold a workpiece to the chuck, and to later release it.)

By admitting hot water to first the periphery of the chuck and having it flow H toward the center, two mechanisms contribute toward accomplishing the goal of heating the periphery faster than the center. First, the hot water arrives at the periphery before it arrives at the center and so the periphery has a head start in heating up as compared to the center. Second, the hot water loses heat to the chuck as it flows toward the center and consequently, the hot water that arrives at the center is cooler than the hot water that flows past the periphery.

However, a countervailing third factor can also be taken into account. If, for example, a flow channel 1223 is provided as simply the space between a top plate 1232 and a bottom plate 1234 of the chuck, the velocity of the fluid will be higher in the center region—because the cross sectional area of the flow is lower in the center region. (Note that the width of the center portions of the channels 1223 is narrower than their widths at the periphery.) This higher velocity can lead to higher rates of heat transfer, thereby causing the temperature of the center of the chuck to change quickly.

Ideally, the heat transfer coefficient would be the same across the entire surface of the chuck (center and periphery). A solution is to add ribs in the periphery region. These ribs can act to increase the rate of heat transfer by two mechanisms. First, by reducing the cross sectional area for flow, the fluid velocity is increased. Second the ribs create additional surface area for heat transfer. An alternate method to enhance the heat transfer at the periphery is by providing turbulators and trip strips, according to methods known in the art of turbine blade cooling design.

Heating and cooling, such that the perimeter is hotter than the center, allows for faster temperature changes than would be possible with methods known in the art that do not accommodate the different effects of expansion and contraction at the center, as compared to at the periphery. For example, a typical method involves fluid flow across a chuck, from one side to the other. The transient temperature patterns resulting would cause wafer fracture from internal stress. Tubes applied in a serpentine pattern would cause similar problems.

Heating can commence either as soon as the wafer is moved to the chuck, or even shortly before it reaches the chuck. Typically, the thermal time constant of the chuck is in the range of approximately 0.3-approximately 1.5 second, preferably at the lower end of the range. If the time constant is 1 second, a period of approximately 3 seconds is required for the temperature to stabilize.

Porous Belt and Spacers and Avoiding Trapped Air

The wafer can be transported into and out of the forming station on a porous belt 703. The porosity of the belt allows for vacuum to be pulled through it. An example of a suitable material is a fiberglass mat impregnated and coated with PTFE (polytetrafluoroethylene) such as Teflon. Such material is available in a range of coating amounts. A porous belt results from a light coating of Teflon such that the space between the glass fibers in the weave remains unfilled. Such material is available from Green Belting Industries of Mississauga, ON L5T 2J3 Canada.

Figure 7A:
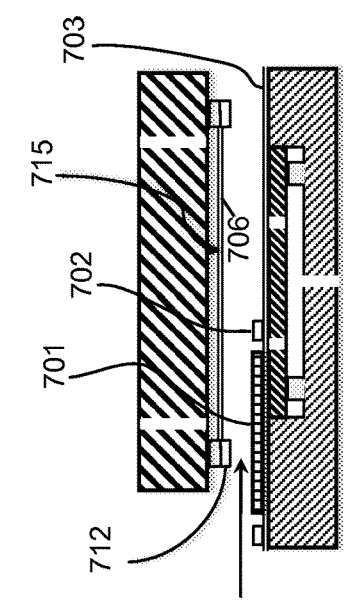
FIG. 7A shows, schematically in cross-section, an apparatus in condition for a step in a process invention hereof, in which a coated substrate is being brought into position upon a chuck, in preparation for being patterned by a flexible stamp.
Figure 7B:
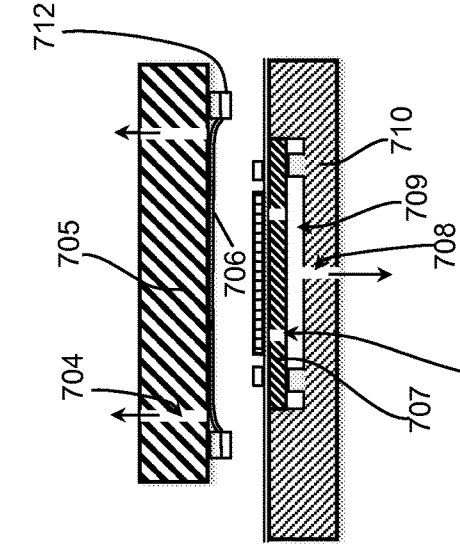
FIG. 7B shows the apparatus of FIG. 7A, with the substrate held in place upon the chuck by a vacuum, and the stamp drawn toward a heated plate.
Figure 7C:
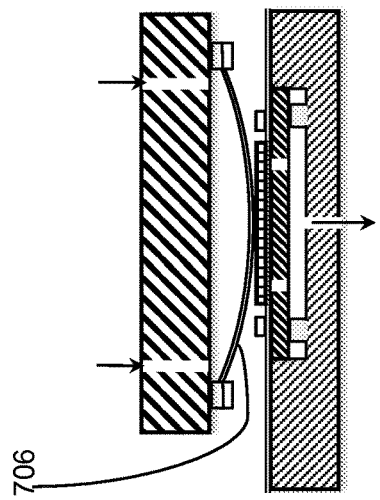
FIG. 7C shows the apparatus of FIG. 7A, with the stamp inflated, with the stamps center beginning to press upon the center of the substrate.
Figure 7D:
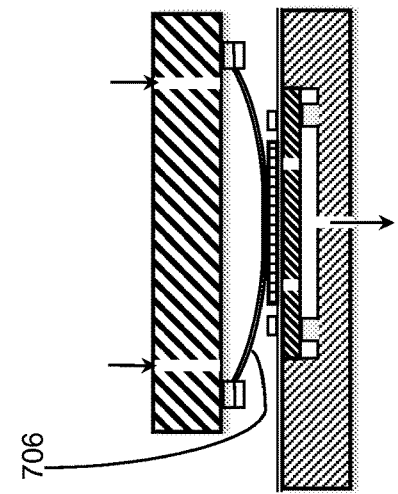
FIG. 7D shows the apparatus of FIG. 7A, with a larger, yet still incomplete portion of the stamp pressed upon the substrate.
Figure 7E:
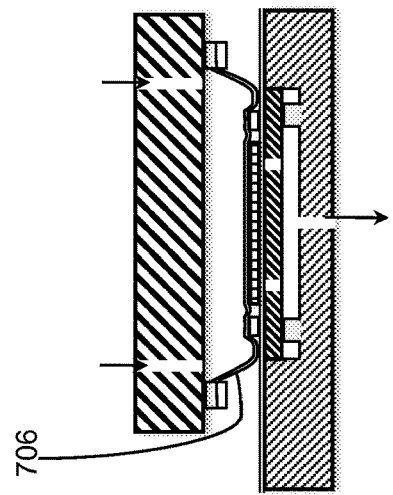
FIG. 7E shows, the apparatus of FIG. 7A, with the stamp fully pressed upon the full extent of the substrate, and also beyond the extent of the substrate.

An important aspect is to prevent trapping air between the tool 706 and the wafer 701. This has several considerations. First, during application of pressure to the plenum 15 behind the tool, it inflates in such a way as to bow out in the center first, as shown in FIG. 7C. The tool 706 then lays down as depicted in the sequence of FIG. 7C. The tool first contacts the resist-coated wafer 1 at the center of both the tool and the wafer, and the lay-down proceeds radially outward as the pressure behind the bladder of the tool 706 is increased. In this way, most of the volume of air that is present between tool and wafer is pushed out radially, as the tool lays down.

The bladder/tool/stamp can be kept under tension even when flat—that is, before inflation. In one embodiment, the bladder can be stretched a designated amount and then the stretched bladder can be clamped between two rings as shown. A way to accomplish this is to place the bladder in a fixture, and pull radially, for instance on a plurality of tabs—for example, twelve such tabs. The rings are then applied inside those tabs. After the rings have been screwed together (clamping the bladder between them), the tabs may be cut off. Typically, the bladder can be stretched by about 1-10%. This amount of stretch can be the same in all directions within the plane of the bladder. Having the bladder under pre-tension helps to ensure that the tool behaves in a predictable and well-defined manner as it lays down on the resist-coated wafer. (Without such pre-tension, the first part of the bladder to touch may be other than in the center and indeed it is possible for a large area of the stamp to touch essentially simultaneously, thereby trapping air. In an extremely detrimental case, it is possible that the perimeter of the stamp will touch down first and trap a pocket of air in the center.)

Pre-tensioning of the stamp also has advantageous effects in helping to manage the impact of the temperature change in the stamp. Consider a stamp without pretension and which is laid down on the resist-coated wafer. The wafer 701 and stamp 706 are then heated up. The coefficient of thermal expansion of the stamp is much higher than that of the wafer (typically 200 E-6/° C. for the stamp, versus 4 E-6/° C.). As a result, the stamp could slide laterally on the wafer both during heat up and cool down. This may cause the pattern imprinted in the resist to be distorted and it may cause a scum layer to be dragged over the holes being formed in the resist. However, if the stamp begins under tension, then any change in temperature will result in a change in the tension of the stamp, but will not result in a change in dimension or geometry of the stamp. For example, consider a piece of flexible material, such as rubber that is free-standing and which has a coefficient of thermal expansion of 200 E-6 1/° C.

If the temperature is elevated by 50° C., this piece of rubber will expand by 200 E-6 1/° C.*50° C.=1%. That is, the thermally induced strain will be 1%. The overall dimensions of the piece of rubber will be 1% larger. If the piece of rubber where a circular stamp, 250 mm in diameter, the diameter of the stamp will now be 252.5 mm. Protrusions on the stamp, which were 20 microns apart before heating will now be 20.2 microns apart.

Now consider, instead, that an identical piece of rubber is held under pretension by clamping it in a ring 712 as described above and that the pretension corresponds to a strain of 3%. Higher levels of prestretch are also possible. When this pre-tensioned stamp is heated up, by 50° C., it does not change in overall size—because the edges are still clamped in the metal ring (which does not change size appreciably). At the same time, the spacing between protrusions on the stamp does not change. What does change is the amount of stress in the plane of the stamp. If the stamp has been heated, then the tensile stress in the stamp reduces. If the stamp has been cooled, then the tensile stress in the stamp increases. In order for the stamp not to change dimension when it is heated, the strain due to pre-stretch should exceed the maximum strain that would have been caused by thermal expansion of a free piece of rubber.

It should be noted that the rings are shown to be generally circular, but this need not be the case. They can be any suitable shape, including square, rectangular, etc.

Once the tool is laid down, there is still a thin layer of air between the tool and the resist in the space not occupied by the indenters. As the pressure behind the tool is increased, the indenters penetrate the resist and, typically, also deform. Both effects lead to a reduction of the volume available for the air. While to some extent, the air between the tool and the resist can compress, such compression leads to an increase in the gas pressure between the stamp and the resist-coated wafer, thereby leading to a reduction of the force on the stamp and a reduction in the size of the holes caused in the resist. Therefore it is important to provide an escape path for the air.

The spacers 702 help to guarantee that such a path remains open. The spacer provides support for the stamp 706 outside the wafer 701 so that when pressure is applied to the stamp 706 it does not wrap around the edges of the wafer 701. Such wrapping would distort the pattern near the edges of the wafer and also potentially seal the stamp to the edges, thereby preventing the escape of trapped air. It might also impede separation of the stamp from the wafer. Thus, the spacer is sized and located so that the stamp remains free of intimate contact with the edges of the wafer.

The height of a spacer, in one embodiment, where the spacer is spaced relatively closely to an edge of the substrate, can be approximately equal to the height of the wafer 701 to be patterned such that a top surface of both the substrate and the spacer is approximately coplanar. In other embodiments, the spacer can be have a top surface that is significantly higher above the top surface of the substrate, in which case the spacer is spaced farther away from an edge of the substrate than in the case of the lower spacer. In general, taking into account other considerations of apparatus size, etc., the spacers can be spaced relatively close to an edge of the substrate, or further away. The further away the spacer is placed, the relatively taller it should be.

For closely spaced spacers, it is beneficial if the spacer stands at least slightly higher than the top of the wafer, (closer to the approaching tool) for instance between about equal with to about 100 microns above the wafer top surface.

The spacer is displaced from the edges of the wafer so that air can escape and travel along this gap. This gap can beneficially also be made wide enough to accommodate the size variation of incoming wafers. For example, for wafers of 156 mm nominal dimension and length tolerance of +/−0.5 mm, the distance between the inside edges of the spacer can be approximately 157 mm. Thus, if a wafer is at the upper end of the tolerance, the gap will be approximately 0.25 mm. If a wafer is at the lower end of the tolerance, the gap will be approximately 0.75 mm. In some cases, the gap might be as large as 1 mm, or as small as 0.15 mm. In a preferred embodiment, the spacers are formed as part of the belt that transports the wafers, or are attached to the belt.

As mentioned above, the spacers can be spaced further away from the substrate, in which case they should have an upper surface that is spaced further above the upper surface of the substrate. For example, spacers can be set with a top surface that is 0.8 mm above a top surface of a wafer of thickness 0.2 mm. Such spacers would be spaced away from the edge of the wafer by 1-10 mm and typically 2-4 mm. An advantage of this taller spacer approach is that the variability in the wafer size would be a small percentage of the gap between the wafer edge and the spacer support and so, the effect of the supports would not change much with wafer size variation. Also the requirement to center the wafer within the spacers would be less stringent. Thus, rather than having a relatively closely positioned spacer having an upper surface of about equal to or 100 microns height above the surface of a wafer, as discussed above, with this more distantly positioned, taller spacer, the spacer may have an upper surface spaced above that of a wafer by as much as 3 mm.

Thus depending on the distance away from the edge of the wafer, which can range from between 0.15 mm to about 1 mm, the top surface of the spacers can rest between approximately even with the top surface of the wafer, to approximately 3 mm above the top surface of the wafer with a preferred range being between 0.1 and 1 mm above the top surface of the wafer, or even further, if other considerations are not compromised.

Peeling the Stamp

Figure 7F:
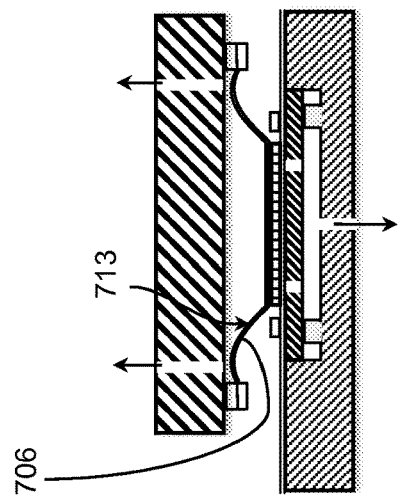
FIG. 7F shows the apparatus of FIG. 7A, as the stamp is beginning to be withdrawn by a vacuum pressure, away from the chuck, yet before the stamp has begun to be peeled from the substrate itself.
Figure 7H:
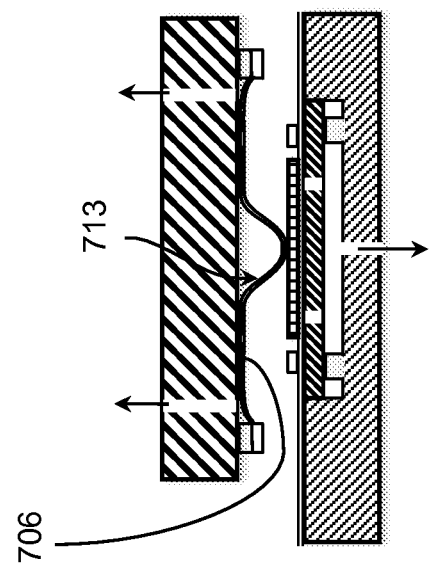
FIG. 7H shows the apparatus of FIG. 7A, as the stamp is peeled even further, almost, but not completely from the substrate.
Figure 7G:
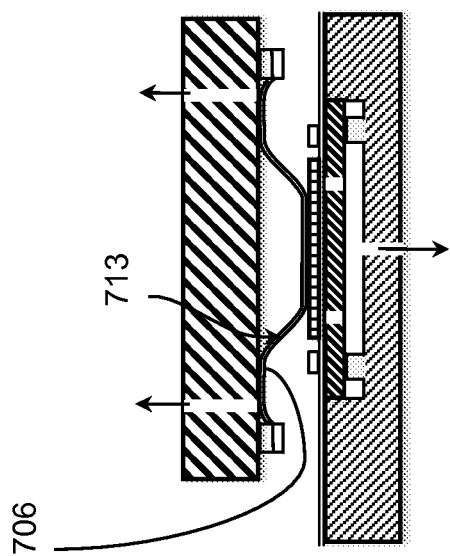
FIG. 7G shows the apparatus of FIG. 7A, as the stamp is peeled further, yet not completely from the substrate.

Once a wafer has cooled down, the stamp must be separated from the patterned resist. In certain embodiments, the stamp is removed (peeled) from the resist. An advantageous method of peeling is to apply a vacuum to the plenum above the tool. Peeling can begin at corners and edges and then proceeds inward. A reason that peeling beneficially begins at the edges is that there is a region 717 of the stamp outside the wafer, which is not touching resist and therefore has no adhesive force holding it down. As shown in FIG. 7F, this region is the first to be pulled up by the application of vacuum above the stamp. The peeling action thus begins at the edges.

During peeling, the wafer 701 continues to be held down to the chuck 707 by vacuum. Once the peel has advanced past the edges, there is vacuum hold-down force being exerted both behind and in front of the peel line. However, at the beginning of the peel—when the peel line is at the edges of the wafer, there only is vacuum hold-down ahead of the peel. As a result, the wafer is more liable to pull away from the vacuum chuck at the start of the peel than it is, once the peel line has advanced inward from the edges. The vacuum hold down at the edges and the corners of the wafer can be accomplished by providing more openings 11 for vacuum under the wafer, near the edges and corners of the wafer 701.

An additional method to achieve peeling at the corners and edges without pulling up the wafer, is to peel more slowly at the beginning of the peel. An additional method to allow for peeling at the corners and edges without pulling up the wafer is to vary the speed of peeling. In other cases, it may be advantageous to peel very rapidly. The preferred speed of peeling is determined by the nature of the interaction of the solidified resist and the stamp. A very rapid peel has the advantage that the peel takes less time and therefore that the production rate goes up. It also has the advantage that the lifting forces applied to the wafer are so rapid that there is not time for the vacuum holding the wafer down to decrease as there is not time for air to flow under the wafer and enter the vacuum plenum. Another method is to reduce the temperature of the wafer and resist below room temperature prior to peeling.

This disclosure describes and discloses more than one invention. The inventions are set forth in the claims of this and related documents, not only as filed, but also as developed during prosecution of any patent application based on this disclosure. The inventors intend to claim all of the various inventions to the limits permitted by the prior art, as it is subsequently determined to be. No feature described herein is essential to each invention disclosed herein. Thus, the inventors intend that no features described herein, but not claimed in any particular claim of any patent based on this disclosure, should be incorporated into any such claim. Alternatively, in certain embodiments, it is contemplated that the independent features can be combined in order to enjoy the benefits and advantages of each feature.

For instance, the inventions that relate to the following different problems are each potentially separate from each other, and can be practiced alone, or in combination with any single other one of the mentioned inventions: A—using a porous belt upon which to transport a workpiece, which will be held down to a work surface by vacuum pressure; B—pre-heating a flexible stamp by drawing it toward a heated plate before applying it to a workpiece; C—applying a flexible stamp to a workpiece by contacting first the center of the stamp to the center of the workpiece, and then causing a contact line to move radially outward from this common center, either using a separate central bladder or not; D—Preventing a flexible stamp from sealing against corner edges of a work piece by providing spacers spaced away from the corner edges of the workpiece, but tall enough and close enough so that the stamp bridges the gap therebetween without draping severely around the corner of the workpiece; E—pretensioning the flexible stamp before it is heated, so that it does not change dimensions when heated and cooled, but rather changes its state of stress; F—removing the stamp from the workpiece after patterning by peeling the stamp away from the workpiece, first at the outside edges and corners, and then gradually inward toward the shared center of the workpiece and stamp; G—heating the workpiece, for instance, but not necessarily by thermally contacting the workpiece to a channeled chuck, having radially extending fluid flow channels and perimeter and central supply conduits, by providing warm fluid at the perimeter, and maintaining conditions such that the perimeter or the workpiece is always warmer than the center of the workpiece; H—cooling the workpiece, for instance, but not necessarily by thermally contacting the workpiece to a channeled chuck, having radially extending fluid flow channels and perimeter and central supply conduits, by providing cool fluid at the center, and maintaining conditions such that the perimeter or the workpiece is always warmer than the center of the workpiece.

Thus, there may be at least eight independent inventions (although the heating and the cooling inventions are somewhat related, but can be practiced independently. Each of these eight independent ideas can be used with any other single idea, and with any two, three, four, five, six, or all seven of the other ideas. Thus, there are 8 choose 2 combinations, which amount to more than fifty possible combinations that are contemplated as sub-combinations of inventions hereof. It would be impractical to list even a small fraction of them independently. However, each one is considered to be an invention hereof, for all jurisdictions, including and explicitly the European Patent Organization.

Some assemblies of hardware, or groups of steps, are referred to herein as an invention. However, this is not an admission that any such assemblies or groups are necessarily patentably distinct inventions, particularly as contemplated by laws and regulations regarding the number of inventions that will be examined in one patent application, or unity of invention. It is intended to be a short way of saying an embodiment of an invention.

An abstract is submitted herewith. It is emphasized that this abstract is being provided to comply with the rule requiring an abstract that will allow examiners and other searchers to quickly ascertain the subject matter of the technical disclosure. It is submitted with the understanding that it will not be used to interpret or limit the scope or meaning of the claims, as promised by the Patent Office's rule.

The foregoing discussion should be understood as illustrative and should not be considered to be limiting in any sense. While the inventions have been particularly shown and described with references to preferred embodiments thereof, it will be understood by those skilled in the art that various changes in form and details may be made therein without departing from the spirit and scope of the inventions as defined by the claims.

The corresponding structures, materials, acts and equivalents of all means or step plus function elements in the claims below are intended to include any structure, material, or acts for performing the functions in combination with other claimed elements as specifically claimed.

ASPECTS OF INVENTIONS

The following aspects of inventions hereof are intended to be described herein, and this section is to ensure that they are mentioned. They are styled as aspects, and although they appear similar to claims, they are not claims. However, at some point in the future, the applicants reserve the right to claim any and all of these aspects in this and any related applications.

1. A method of applying a flexible tool to a substrate, comprising the steps of;
   a. contacting the flexible tool to a heated body;
   b. maintaining the flexible tool in contact with the heated body for a time sufficient to heat the tool to a required temperature;
   c. releasing the tool from contact with the heated body; and
   d. advancing the tool toward a substrate, and into contact with the substrate.
2. The method of aspect 1, the step of contacting the flexible tool comprising drawing the tool in a first direction, away from the substrate, to contact a heated body.
3. The method of aspect 2, the step of drawing the flexible tool comprising applying a first pressure, in a space between the flexible tool and the heated body, which first pressure is less than a second pressure that is between the flexible tool and the substrate.
4. The method of aspect 3, the first pressure comprising a vacuum pressure.
5. The method of any of aspects 1-3, the step of advancing the tool toward the substrate comprising applying a third pressure in a space between the flexible tool and the heated body, which third pressure is greater than a fourth pressure that is between the flexible tool and the substrate.
6. A method of applying a flexible tool having a center and a periphery, to a substrate also having a center and a periphery, comprising the step of advancing the center of the flexible tool toward the center of the substrate, such that the center of the flexible tool contacts the center of the substrate before any other portion of the tool contacts the substrate.
7. The method of aspect 6, the step of advancing the center of the flexible tool comprising providing a bladder on a side of the flexible tool opposite a side of the tool facing the substrate, and inflating the bladder to contact and force the center of the flexible tool toward the substrate.
8. The method of any of aspects 5-7, further comprising the steps of contacting the tool to the substrate at a line that advances radially outward from the center of the tool as more tool area contacts the substrate.
9. The method of aspect 8, the line comprising a circle having a radius that increases as more tool area contacts the substrate.
10. The method of any of aspects 6-9, the step of contacting the tool comprising contacting successive areas of the substrate without trapping pockets of air between the tool and the substrate.
11. The method of any of aspects 7-10, further comprising the step of withdrawing the bladder from contact with the flexible tool while the flexible tool is contacting the substrate.
12. A method of applying a flexible tool having a periphery to a substrate, also having a periphery, comprising the steps of;
   a. providing the substrate upon a carrier;
   b. providing, on the carrier, at least partially surrounding and spaced away from the periphery of the substrate by a space, a spacer;
   c. contacting a tool having a periphery with the substrate and the spacer, the tool of a dimension that is larger than that of the substrate and spacer, such that the tool bridges the space.
13. The method of aspect 12, the substrate and the spacer each having a top surface, the spacer being sized such that its top surface is approximately coplanar with the top surface of the substrate.
14. The method of aspect 12, the substrate and the spacer each having a top surface, the spacer being sized such that its top surface is slightly higher than the top surface of the substrate.
15. The method of aspect 12, the substrate and the spacer each having a top surface, the spacer being sized such that its top surface is at a location at least approximately 100 microns and less than about 3 mm higher than the top surface of the substrate.
16. The method of any of aspects 12-15, the space being between approximately 0.15 and approximately 10 mm.
17. The method of any of aspects 12-16, further wherein the carrier is a transport belt upon which the substrate is transported, the spacers comprising elements secured to the belt.
18. The method of any of aspects 12-16, further wherein the carrier is a transport belt upon which the substrate is transported, the spacers comprising integral components of the belt.
19. A method of heating an extended substrate workpiece having a center and a periphery comprising the steps of:
   a. providing a chuck having fluid flow channels therethrough;
   b. placing the workpiece upon the substrate;
   c. providing heating fluid to the flow channels such that the periphery of the workpiece is always maintained at or above the temperature of the center of the workpiece.
20. The method of aspect 19, the step of providing a chuck having fluid flow channels that comprise:
   a. a central conduit;
   b. at least one peripheral conduit; and
   c. a plurality of radial channels, each in hydraulic communication with the central conduit and at least one peripheral conduit.
21. The method of aspect 19, the at least one perhipheral conduit comprising a plurality of peripheral conduits.
22. The method of any of aspects 20-21, the step of providing heating fluid comprising providing warming fluid to the at least one peripheral conduits, and causing the fluid to flow radially inward along the radial channels toward and through the central conduit.
23. The method of any of aspects 19-22, further comprising the step of cooling the workpiece by providing cooling fluid to the flow channels such that the periphery of the workpiece is always maintained at or above the temperature of the center of the workpiece.

24. The method of aspects 23, the step of providing cooling fluid comprising providing cooling fluid to the central conduit and causing the fluid to flow radially outward along the radial channels toward and through at least one peripheral conduits.
25. A method of cooling an extended substrate workpiece having a center and a periphery comprising the steps of:
    a. providing a chuck having fluid flow channels therethrough;
    b. placing the workpiece upon the substrate;
    c. providing cooling fluid to the flow channels such that the periphery of the workpiece is always maintained at or above the temperature of the center of the workpiece.
26. The method of aspect 25, the step of providing a chuck having fluid flow channels that comprise:
    a. a central conduit;
    b. at least one peripheral conduits; and
    c. a plurality of radial channels, each in hydraulic communication with the central conduit and the at least one peripheral conduit.
27. The method of aspect 26, the step of providing cooling fluid comprising providing cooling fluid to the central conduit and causing the fluid to flow radially outward along the radial channels toward and through at least one of the plurality of peripheral conduits.
28. A chuck for securing a workpiece, the chuck comprising:
    a. a central portion and a periphery;
    b. fluid flow channels comprising:
        i. a central conduit;
        ii. at least one peripheral conduits; and
    c. a plurality of radial channels, each having a central end and a peripheral end, in hydraulic communication with the central conduit and the at least one peripheral conduit.
29. The chuck of aspect 28, the at least one peripheral conduits comprising a plurality of conduits.
30. The chuck of any of aspects 28-29, further comprising an element to increase heat transfer from fluid flowing through channels at the periphery, as compared to near the center.
31. The chuck of aspect 30, the element to increase heat transfer comprising, in at least one radial channel, a rib located at least in part near the peripheral end of the channel.
32. The chuck of aspect 30, the element to increase heat transfer comprising a turbulator.
33. The chuck of any of aspects 30-32, the element to increase heat transfer comprising a trip strip.
34. The chuck of any of aspects 28-33, further comprising a workpiece station, and channels arranged to permit a vacuum to be drawn through the chuck to secure a workpiece in place at the workpiece station.
35. A method of applying a flexible tool to a substrate, comprising the steps of:
    a. providing a substrate near to a flexible tool comprising a planar flexible element;
    b. applying tension to the flexible tool, which tension is substantially equal in all directions within the plane of the flexible element;
    c. advancing the tool toward the substrate, and into contact with the substrate.
36. The method of aspect 35, the step of applying tension comprising clamping the flexible element between a pair of rings.
37. The method of any of aspects 35-36, the step of applying tension to the tool comprising pulling radially outward at a plurality of at least 4 peripheral locations.
38. A method of removing a flexible tool having a center and a periphery from a substrate, also having a center and a periphery, comprising the step of withdrawing the periphery of the flexible tool away from the periphery of the substrate, such that the center of the flexible tool remains in contact with the center of the substrate after all other portions of the tool are withdrawn from the substrate, such that the center of the tool separates from the substrate after all other parts of the tool.
39. The method of aspect 38, further comprising the steps of withdrawing the tool from the substrate at a line that advances radially inward toward the center of the tool as less tool area contacts the substrate.
40. The method of any of aspects 38 and 39, the line comprising a circle having a radius that decreases as less tool area contacts the substrate.
41. The method of any of aspects 38-40, the step of withdrawing being conducted by providing a differential pressure to two faces of the tool.
42. A method of applying a flexible tool to a substrate and a flowable layer on a surface thereof, comprising the steps of;
    a. providing a flexible tool comprising a planar flexible element in an environment with a substrate, the planar element carrying a pattern and also being in tension that is substantially equal in all directions within the plane of the flexible element;
    b. contacting the flexible element to the flowable layer under heat, the degree of heating of the flexible tool relative to the degree of tension being such that the flexible tool remains in tension during the contacting step.
43. The method of aspect 42, further comprising the step of allowing the flexible tool to cool.
44. The method of any of aspects 42-43, the heat being established by applying heat to at least one of the substrate, the flexible tool and the environment.
45. The method of any of aspects 42-44, wherein the degree of heating is such that the dimensions of the pattern carried on the tool do not change.
46. The method of any of aspects 42-45, the step of providing a planar element in tension comprising providing a planar element in tension to a degree that corresponds to a strain that exceeds a maximum strain that would have been caused by thermal expansion of the flexible tool, were it free to expand during the step of applying heat.
47. The method of any of aspects 42-46, the flexible tool comprising a flexible element clamped between a pair of rings.
48. The method of aspect 47 the flexible tool comprising a planar sheet and a plurality of tabs located at at least 4 peripheral locations.
49. The method of any of aspects 42-48, the flexible tool having a center and a periphery, the substrate also having a center and a periphery, the method further comprising the step of advancing the center of the flexible tool toward the center of the substrate, such that the center of the flexible tool contacts the center of the substrate before any other portion of the tool contacts the substrate.
50. The method of aspect 49, the step of advancing the center of the flexible tool comprising inflating the flexible tool.

51. The method of aspect 49, the step of advancing the center of the flexible tool comprising providing a bladder on a side of the flexible tool opposite a side of the tool facing the substrate, and inflating the bladder to contact and force the center of the flexible tool toward the substrate.

52. The method of any of aspects 49-51, further comprising, after the center of the flexible tool contacts the flowable material, the step of inflating the flexible tool so that substantially its full extent contacts the flowable material.

53. The method of any of aspects 49-52, further comprising the steps of contacting the tool to the flowable material at a line that advances radially outward from the center of the tool as more tool area contacts the flowable material.

54. The method of aspect 53, the line comprising a circle having a radius that increases as more tool area contacts the flowable material.

55. The method of any of aspects 49-54, the step of contacting the tool comprising contacting successive areas of the flowable material without trapping air pockets between the tool and the flowable material.

56. The method of aspect 51, further comprising the step of withdrawing the bladder from contact with the flexible tool while the flexible tool is contacting the flowable material.

57. The method of aspect 50, the step of inflating the flexible tool comprising providing pressure of between about 0.1 and 2 atm gauge on a side of the flexible tool opposite a side of the tool facing the substrate.

58. The method of aspect 51, the step of inflating the bladder comprising providing pressure of about 0.5 atm gauge to the bladder.

The invention claimed is:

1. A method of applying a flexible tool to a substrate and a flowable layer on a surface thereof, comprising the steps of:
   a. providing, at a first temperature, a flexible tool comprising a planar flexible element having a coefficient of thermal expansion and carrying a pattern and also being retained in a fixture, in tension, at least in part by clamping the tensioned planar flexible element between a pair of rings, which amount of tension is substantially the same in all directions within the plane of the planar flexible element;
   and followed by the step of:
   b. contacting the planar flexible element to the flowable layer under heat, during which step of contacting, the temperature of the planar flexible element is a second, different temperature, which is higher than the first temperature, the degree of temperature difference of the planar flexible element relative to the degree of tension and the coefficient of thermal expansion and the structure of the fixture being such that the planar flexible element remains in the fixture, in tension in an amount that is substantially the same in all directions within the plane of the planar flexible element during the contacting under heat step.

2. The method of claim 1, the heat being established by applying heat to at least one of the substrate, the planar flexible element and the environment.

3. The method of claim 1, wherein the degree of temperature difference is such that the dimensions of the pattern carried on the planar flexible element do not change.

4. The method of claim 1, the step of providing a planar flexible element in tension comprising providing a planar flexible element in tension in an amount that corresponds to a strain that exceeds a maximum strain that would have been caused by thermal expansion of the planar flexible element, were it free to expand during the step of contacting the planar flexible element to the flowable layer under heat.

5. The method of claim 1, the planar flexible element having a center and a periphery, the substrate also having a center and a periphery, the method further comprising the step of advancing the center of the planar flexible element toward the center of the substrate, such that the center of the planar flexible element contacts the center of the substrate before any other portion of the planar flexible element contacts the substrate.

6. The method of claim 5, the step of advancing the center of the planar flexible element comprising inflating the planar flexible element.

7. The method of claim 6, the step of inflating the flexible tool comprising providing pressure of between about 0.1 and 2 atm gauge on a side of the planar flexible element opposite a side of the planar flexible element facing the substrate.

8. The method of claim 5, the step of advancing the center of the planar flexible element comprising providing a bladder on a side of the planar flexible element opposite a side of the planar flexible element facing the substrate, and inflating the bladder to contact and force the center of the planar flexible element toward the substrate.

9. The method of claim 8, further comprising, after the center of the planar flexible element contacts the flowable material, the step of inflating the bladder so that substantially the full extent of the planar flexible element contacts the flowable material.

10. The method of claim 8, further comprising the step of withdrawing the bladder from contact with the planar flexible element while the planar flexible element is contacting the flowable material.

11. The method of claim 8, the step of inflating the bladder comprising providing pressure of about 0.5 atm gauge to the bladder.

12. The method of claim 5, further comprising the step of contacting the planar flexible element to the flowable material at a line that advances radially outward from the center of the planar flexible element as more planar flexible element area contacts the flowable material.

13. The method of claim 12, the line comprising a circle having a radius that increases as more planar flexible element area contacts the flowable material.

14. The method of claim 5, the step of contacting the planar flexible element comprising contacting successive areas of the flowable material without trapping air pockets between the planar flexible element and the flowable material.

15. The method of claim 1, wherein the planar flexible element is stretched by about 1-10% before being clamped between the pair of rings.

* * * * *